United States Patent
Repetto et al.

(10) Patent No.: US 7,952,017 B2
(45) Date of Patent: May 31, 2011

(54) MULTIFOCAL LIGHT CONCENTRATOR FOR A DEVICE FOR THE CONVERSION OF RADIATION, AND IN PARTICULAR FOR THE CONVERSION OF SOLAR RADIATION INTO ELECTRICAL, THERMAL OR CHEMICAL ENERGY

(75) Inventors: Piermario Repetto, Orbassano (IT); Denis Bollea, Orbassano (IT); Davide Capello, Orbassano (IT); Stefano Bernard, Orbassano (IT); Pietro Perlo, Orbassano (IT)

(73) Assignee: CRF Societa Consortile per Azioni, Orbassano (Torino) (IT)

( * ) Notice: Subject to any disclaimer, the term of this patent is extended or adjusted under 35 U.S.C. 154(b) by 630 days.

(21) Appl. No.: 10/947,305

(22) Filed: Sep. 23, 2004

(65) Prior Publication Data
US 2005/0121071 A1 Jun. 9, 2005

(30) Foreign Application Priority Data
Sep. 24, 2003 (IT) .............................. TO2003A0734

(51) Int. Cl.
*H01L 31/00* (2006.01)
*H01L 25/00* (2006.01)
*H01L 31/042* (2006.01)
*G02B 3/08* (2006.01)
*F24J 2/40* (2006.01)
*F24J 2/38* (2006.01)

(52) U.S. Cl. ........ 136/246; 136/243; 136/244; 359/742; 126/572; 126/573

(58) Field of Classification Search .................. 136/246; 362/342
See application file for complete search history.

(56) References Cited

U.S. PATENT DOCUMENTS 899,533 A 12/1899 O'Neill et al.
3,234,931 A * 2/1966 Whitaker ...................... 126/688
(Continued)

FOREIGN PATENT DOCUMENTS

DE 298 08 0874 U 9/1998
(Continued)

OTHER PUBLICATIONS

MacDonald et al., Handbook of Optics: vol. III Classic Optics, Vision Optics, X-Ray Optics, McGraw-Hill, 2001, p. 19.7.*
(Continued)

*Primary Examiner* — Alexa D Neckel
*Assistant Examiner* — Shannon Gardner
(74) *Attorney, Agent, or Firm* — Sughrue Mion, PLLC

(57) ABSTRACT

A light concentrator is described, for a device for the conversion of solar radiation into electrical, thermal or chemical energy, capable of conveying the radiation towards a surface of the conversion device. The concentrator comprises at least one portion of Fresnel lens of rotational symmetry, one face of which has a plurality of crests disposed concentrically about a center so as to form a segmented transverse profile of the portion of Fresnel lens. The profile is formed in such a manner that the focal distance of the Fresnel lens is variable in dependence on the radial distance from the center of the lens. The variation of the focal distance is determined such that, when the Fresnel lens is illuminated by polychromatic radiation, the superposition of the distributions of irradiance, produced by the lens at the individual wavelengths constituting the spectrum of the incident radiation, generates a substantially uniform distribution of polychromatic irradiance on the conversion device.

16 Claims, 13 Drawing Sheets

U.S. PATENT DOCUMENTS

| | | | |
|---|---|---|---|
| 4,210,391 A * | 7/1980 | Cohen | 351/161 |
| 4,312,330 A | 1/1982 | Holdridge | |
| 4,337,759 A * | 7/1982 | Popovich et al. | 126/684 |
| 4,514,040 A | 4/1985 | Pinelli et al. | |
| 4,530,576 A | 7/1985 | Pinelli et al. | |
| 4,799,778 A | 1/1989 | Jebens | |
| 4,844,598 A | 7/1989 | Mori | |
| 6,399,874 B1 * | 6/2002 | Olah | 136/259 |

FOREIGN PATENT DOCUMENTS

| | | | |
|---|---|---|---|
| DE | 100 36 073 A | | 2/2002 |
| DE | 102 03 106 A | | 7/2003 |
| FR | 2318431 A | | 2/1977 |
| FR | 2 546 336 A | | 11/1984 |
| GB | 375685 A | | 6/1932 |
| JP | 54121149 A | | 9/1979 |
| JP | 57144502 A | | 9/1982 |
| JP | 11026800 A | | 1/1999 |
| WO | 9631742 A | | 10/1996 |
| WO | WO 98/27448 A | | 6/1998 |

OTHER PUBLICATIONS http://en.wikipedia.org/wiki/Fresnel_lens: aceessed Dec. 24, 2007.*

M. F. Piszczor et al: "Design & Development of a Line-Focus Regractive Concentrator Array for Space", colleciton of Technical Papers from the Intersociety Energy Conversion Engineering Conference. M onteray. Aug. 7-11, 1994, Proceedings of the Intersociety Energy Conversion Engineering Conference (IECEC). New York, IEEE. US. vol. I, Conf. 29, Aug. 7, 1994, pp. 282-287, XP000527621, ISBN: 1-56347-091-8.

O'Neil M.J., et. al., "The Mini-Dome Lens Space Concentrator Array . . . ".

* cited by examiner

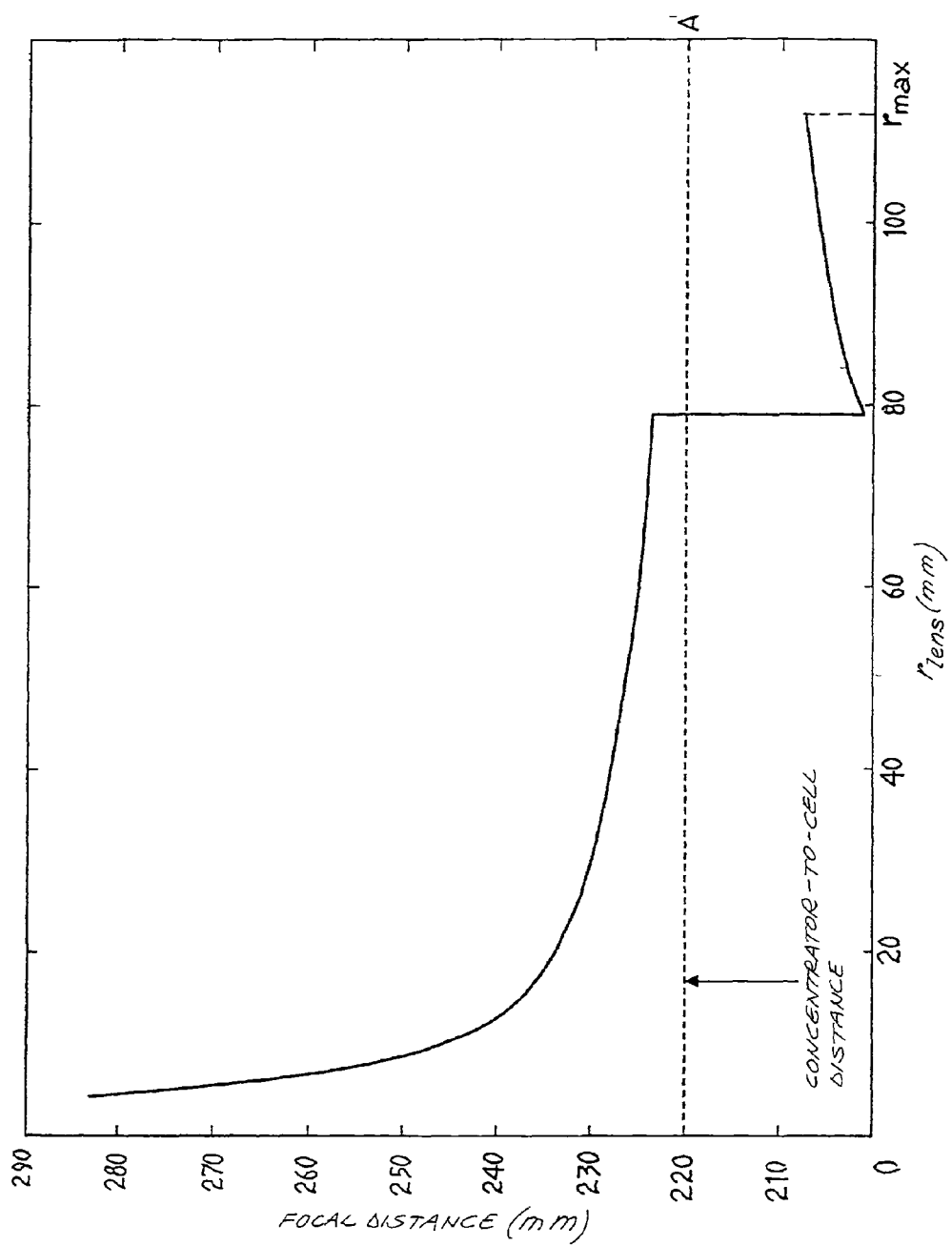

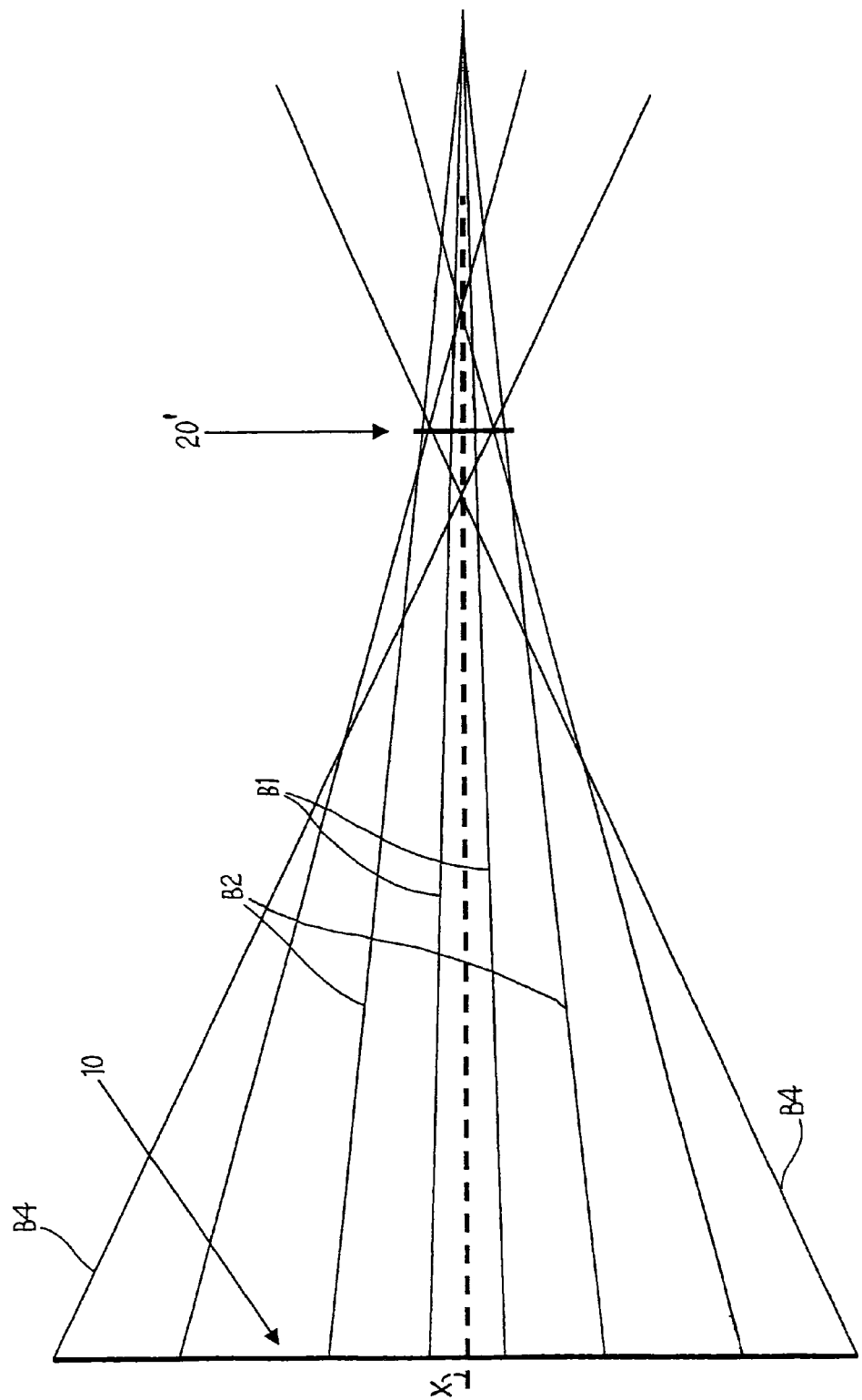

POLYCHROMATIC IRRADIANCE FOR X=220 mm (Lumen/mm²)

MULTIFOCAL LIGHT CONCENTRATOR FOR A DEVICE FOR THE CONVERSION OF RADIATION, AND IN PARTICULAR FOR THE CONVERSION OF SOLAR RADIATION INTO ELECTRICAL, THERMAL OR CHEMICAL ENERGY

BACKGROUND OF THE INVENTION

The present invention refers to a light concentrator, of the type used in particular in devices for the conversion of the radiant energy of the luminous radiation emitted by the sun into chemical, thermal or electrical energy, such as for example photovoltaic cells.

As is known, the use of solar energy presents technical and economic problems linked to the low energetic density of solar radiation, to its discontinuity (alternation of day/night, cycle of seasons, variation in the meteorological conditions) and to the modest value of the conversion yields (typically below 25%).

Such factors render the difference between the potential capacities and the practical possibilities of use significant. Among the various technologies perfected up to now for the exploitation of solar energy, photovoltaic technology is the most promising, in the medium or long term, by virtue of its characteristics of modularity, simplicity, reliability and reduced requirement for maintenance. The photovoltaic process, as is known, is based on the capacity of some suitably treated semiconductor materials, such as silicon, for generating electrical energy directly when they are exposed to solar radiation.

The conversion of solar radiation takes place with a yield of 12-15% in the photovoltaic cell; each cell is capable of producing around 1.5 watts at voltages of 0.6 volts; tens of electrically connected cells form a module (for 40-50 watts overall), which is the elementary component of the photovoltaic systems; more modules connected in series and/or in parallel are capable of providing the power required by the various applications.

One of the solutions currently used in the photovoltaic modules is that of concentration of the solar radiation: instead of using a photovoltaic cell of large dimensions, the concentration solution uses a concentrator of large dimensions which focuses the solar radiation onto a cell of reduced dimensions. This makes it possible, with parity of the area of the module exposed to radiation, to reduce the dimensions of the cell. In order for the concentration solution to be advantageous in economic terms, it is necessary that the saving on the cost of the photovoltaic cell is not entirely compensated by increments in the cost of the system. A concentration system in fact requires, in addition to the concentrator, a system for following, or "tracking" the solar disc, so that the module is always oriented in the correct direction; tracking the sun permits a doubling of the energy captured compared with concentrators in a fixed position. Tracking may be carried out both by means of analog control of electric motors arranged for movement of the module, and by means of digital control thereof, using a suitably programmed microcontroller. The same microcontroller may also detect the operating characteristics of the panel over time (temperature reached, electrical power produced or amount of water heated per unit of time) which it may then periodically transmit to a processor by means of a serial connection for displaying and storing the data.

Moreover, in the case of the concentration solution, the high density of incident radiation on the cell renders necessary a particularly efficient heat dissipation system in order to avoid loss of efficiency of the cell or even breakage of the latter.

The concentrator may work by reflection or by transmission. Transmission concentrators are typically formed of Fresnel lenses, inasmuch as a Fresnel lens guarantees the same capacity of concentration as conventional lenses but, with parity of diameter, has the advantage of having reduced thicknesses. This factor permits the construction of lenses by means of injection moulding processes without introducing deformations due to the removal of material deriving from the uneven thickness.

The Fresnel lenses conventionally used as concentrators in photovoltaic cells typically have a single focal length, i.e. focus all the incident radiation at one point of the optical axis placed a predetermined distance from the lens; this is obtained with flat Fresnel lenses, having a profile of the microreliefs of aspheric type, that is, such as to compensate for spherical aberration and to allow focusing of all the incident rays into a single point. In order to obtain uniform illuminance on the plane of the conversion cell it is typically sufficient for the focal plane of the lens and the plane in which the cell is positioned to be separated by a certain distance; this is equivalent to introducing a defocus, which produces a uniform distribution of irradiance on the plane of the cell.

This ideal situation, in which all the cell is uniformly illuminated, does not however take into account the polychromaticity of the incident radiation on the concentrator; as is known, the focal power of any optical element in transmission depends strongly on the wavelength, inasmuch as the refractive index of the material varies as the wavelength varies.

The wavelength at which the focal distance F of the lens is defined being called "reference wavelength" $\lambda_1$, the focal distance at a general wavelength $\lambda_2$ in paraxial approximation (i.e. with rays which spread at small angles with respect to the optical axis) varies according to the law:

$$F(\lambda_2) = F(\lambda_1)\frac{n(\lambda_1) - 1}{n(\lambda_2) - 1}$$

In general, in regions of the spectrum that are characterised by a so-called "normal dispersion", the refractive index decreases as the wavelength increases, and therefore the focal length increases. This sets practical limits on the ratio of concentration (ratio between the surface area of the lens and the surface area of the cell) that can be achieved with a concentrator in transmission; in fact, by way of example, if the concentrator is calculated to focus a green wavelength on the plane of the cell, a blue wavelength will be focused in a plane closer to the lens, while a red wavelength will be focused at a point further from the lens. The green will then be concentrated in a point region on the plane of the cell, while the red and the blue will have a broader distribution of irradiance; the dimension of the lens being defined, the dimensions of the cell cannot therefore be reduced indefinitely inasmuch as the chromatic dispersion would cause a large part of the red and blue radiation to fall outside the cell, compromising its efficiency. In order to cause more than 80% of the radiation to fall on the conversion cell, it is expedient for the value of the focal length to be very close to that of the concentrator-to-cell distance for an intermediate wavelength of the solar spectrum; the result is that the distribution of polychromatic irradiance becomes not very uniform and has a very high central peak; this peak persists even when varying the concentrator-to-cell distance (FIGS. 1a, b, c).

The presence of irradiance peaks on the plane of the cell is generally a problem, inasmuch as it means that the regions of the cell with higher irradiance reach very high temperatures, compromising both the conversion efficiency of the cell and the integrity of the lens itself.

SUMMARY OF THE INVENTION

The aim of the present invention is to produce a concentrator in transmission having high efficiency values (above 80%) and at the same time uniformity in the distribution of polychromatic irradiance on the plane of the cell.

This aim is achieved according to the invention by a light concentrator for a radiation conversion device having the characteristics defined in Claim 1. This aim is therefore achieved by means of a Fresnel lens that is multifocal, or having a focal length which is not constant but variable in dependence on the distance from the centre of the lens itself, the variation of said focal length being determined so as to maximise the distribution of polychromatic irradiance on the plane of the cell.

Preferred embodiments of the concentrator are defined in the dependent claims.

As will be appreciated, the concentrator according to the invention is not limited exclusively to the photovoltaic modules described hereinafter, but may also be used in other possible systems for conversion of radiant energy, and in particular of solar radiation, into various forms of energy, for example in systems for converting solar energy into thermal energy, or into chemical energy. It may in fact be used in solar collectors for the direct conversion of the radiant energy of the sun into thermal energy to be used for heating or for inverting a combustion reaction, i.e. for the regeneration of fuel and comburent from products of combustion.

BRIEF DESCRIPTION OF THE DRAWINGS

A description will now be given of preferred but non-limiting embodiments of the invention, with reference to the appended drawings, in which:

FIGS. 3a, 3c, 3b and 3d are graphs which represent possible variations of the focal distance in dependence on the radial distance from the centre of the lens for a concentrator according to FIG. 2a;

FIGS. 4a and 4b illustrate the correspondence of the rays (to a reference wavelength) according to the concentrator which exhibits the variation of the focal distance as in FIG. 3c;

DETAILED DESCRIPTION OF THE INVENTION

Figure 1A:
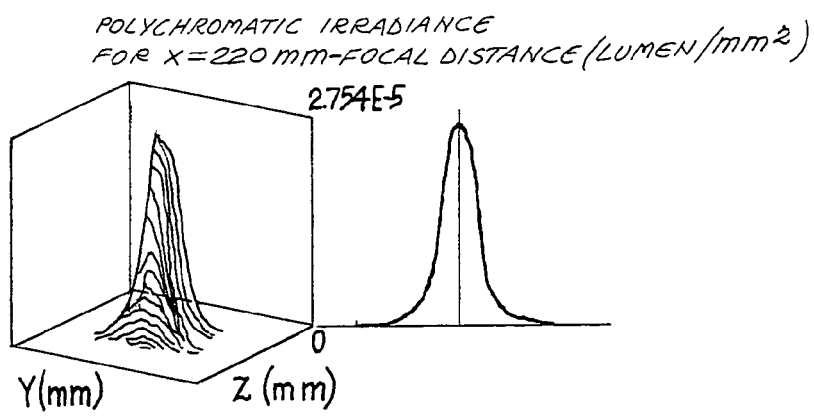
FIGS. 1a,b,c are graphs which represent the distribution of illuminance in a concentrator with conventional Fresnel lens for different axial distances from the lens.
Figure 1B:
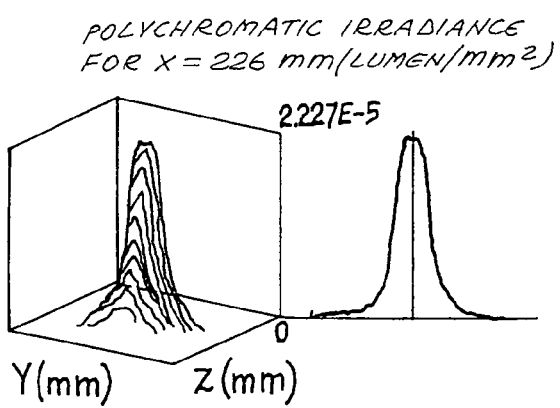
Figure 1C:
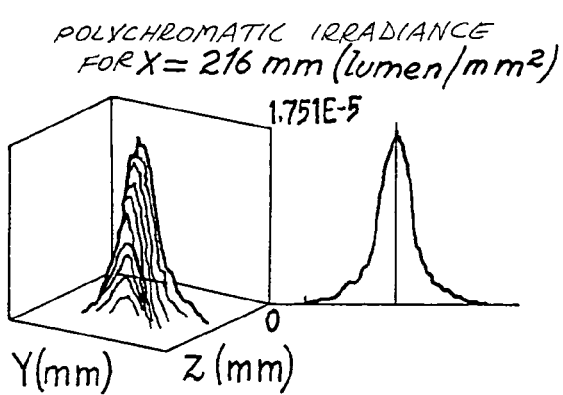
Figure 2A:
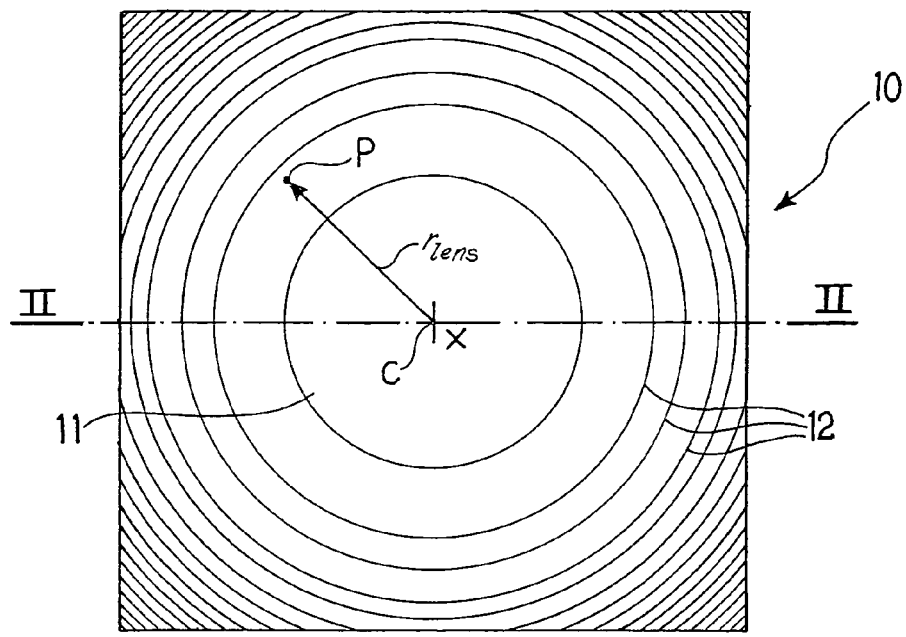
FIGS. 2a and 2b are diagrammatic views respectively in plan and in diametral section of a variant of the concentrator according to the invention.

With reference to FIGS. 2a, b, a concentrator 10 according to the invention is illustrated, capable of concentrating the luminous (and, if required, infrared and ultraviolet) radiation incident on a conversion device (not illustrated) capable of converting such radiation into another form of energy, for example electrical, thermal or chemical energy. Hereinafter, for such a device, for the sake of simplicity reference will be made to a conventional photovoltaic cell.

Figure 4A:
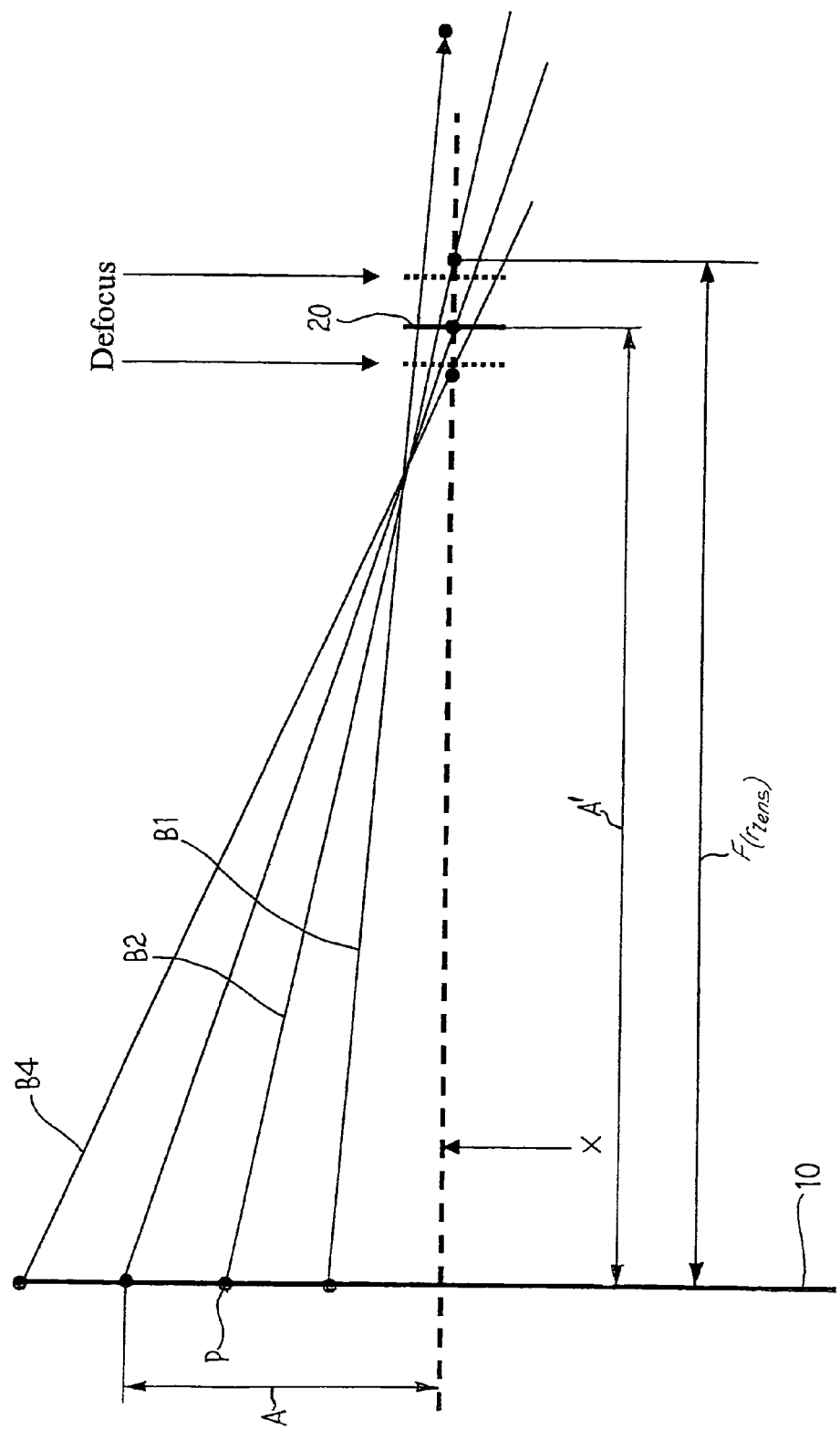

The concentrator 10, having a square shape in the present example, is formed substantially of a multifocal Fresnel lens. The term "multifocal" means that, given a general point P of the lens placed at a distance $r_{lens}$ from the centre C of the lens itself, the focal distance F is dependent on $r_{lens}$; the focal distance $F(r_{lens})$ at the point P is defined as the distance between the plane of the lens and the plane perpendicular to the optical axis x and passing through the point of intersection between the optical axis and the ray refracted by the point P (FIG. 4a).

The Fresnel lens 10 has a face 11, on which annular protruding portions 12, disposed concentrically about the centre C of the lens 10, are provided.

Figure 2B:
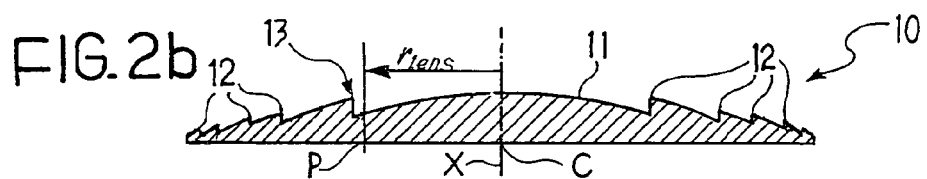

The section of the Fresnel lens (see FIG. 2b) thus has a segmented profile 13 formed by a sequence of crests and valleys, typical of Fresnel lenses; the outermost annular portions 12 may be arranged so as to deflect the light by the effect of a combination of refraction and total internal reflection.

Figure 3A:
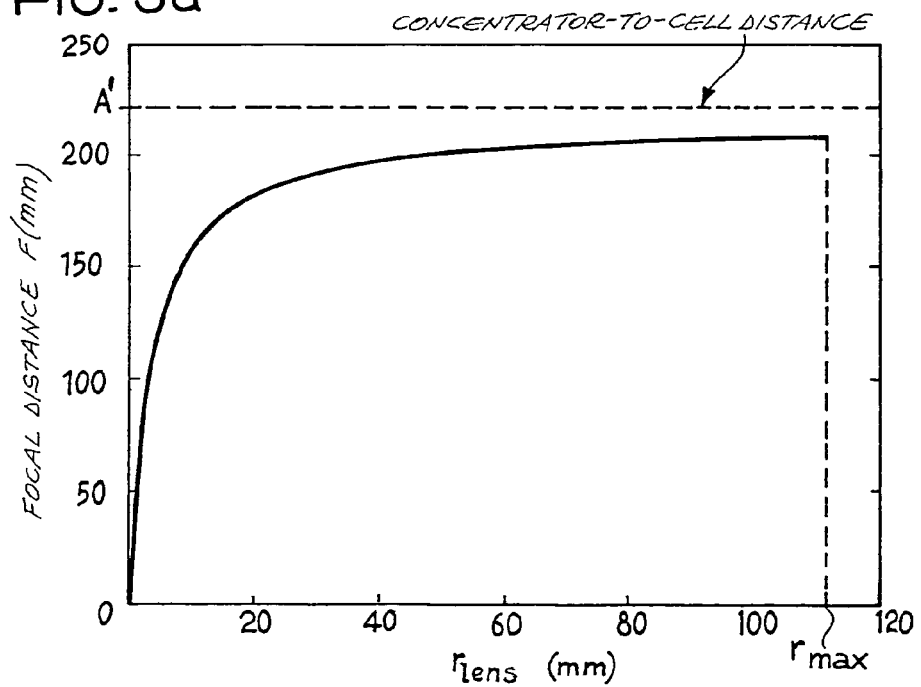

The variation of the focal distance F may be of two types. The first provides for the distance F to be close to 0 at the centre C of the lens (i.e. for $r_{lens}=0$) and to reach a maximum value at the edge (i.e. for $r_{lens}=r_{max}$), said maximum value being close to the value of the concentrator-to-cell distance (FIG. 3a, 3d); the second provides that at $r_{lens}=0$ the focal distance F assumes a maximum value (preferably greater than 10% of the value of the concentrator-to-cell distance) and decreases as $r_{lens}$ increases until it reaches a minimum value at $r_{lens}=r_{max}$, said minimum value being close to the value of the concentrator-to-cell distance (FIG. 3b, 3c).

The focal distance F may be greater than the concentrator-to-cell distance in a radial portion of the lens, whereas it may become less than the concentrator-to-cell distance in the remaining portion of the lens, or vice versa (eg. FIGS. 3b, 3c and 3d).

The transition may take place continuously (FIGS. 3b and 3d) or discontinuously (FIG. 3c). This makes it possible to achieve a greater tolerance to defocus compared with a system in which $F(r_{lens})$ remains less or greater than the concentrator-to-cell distance on the whole surface area of the cell. A system tolerant to defocus is a system in which errors of positioning of the plane of the cell with respect to the lens do not compromise either the efficiency or the uniformity of irradiance on the cell.

Figure 3B:
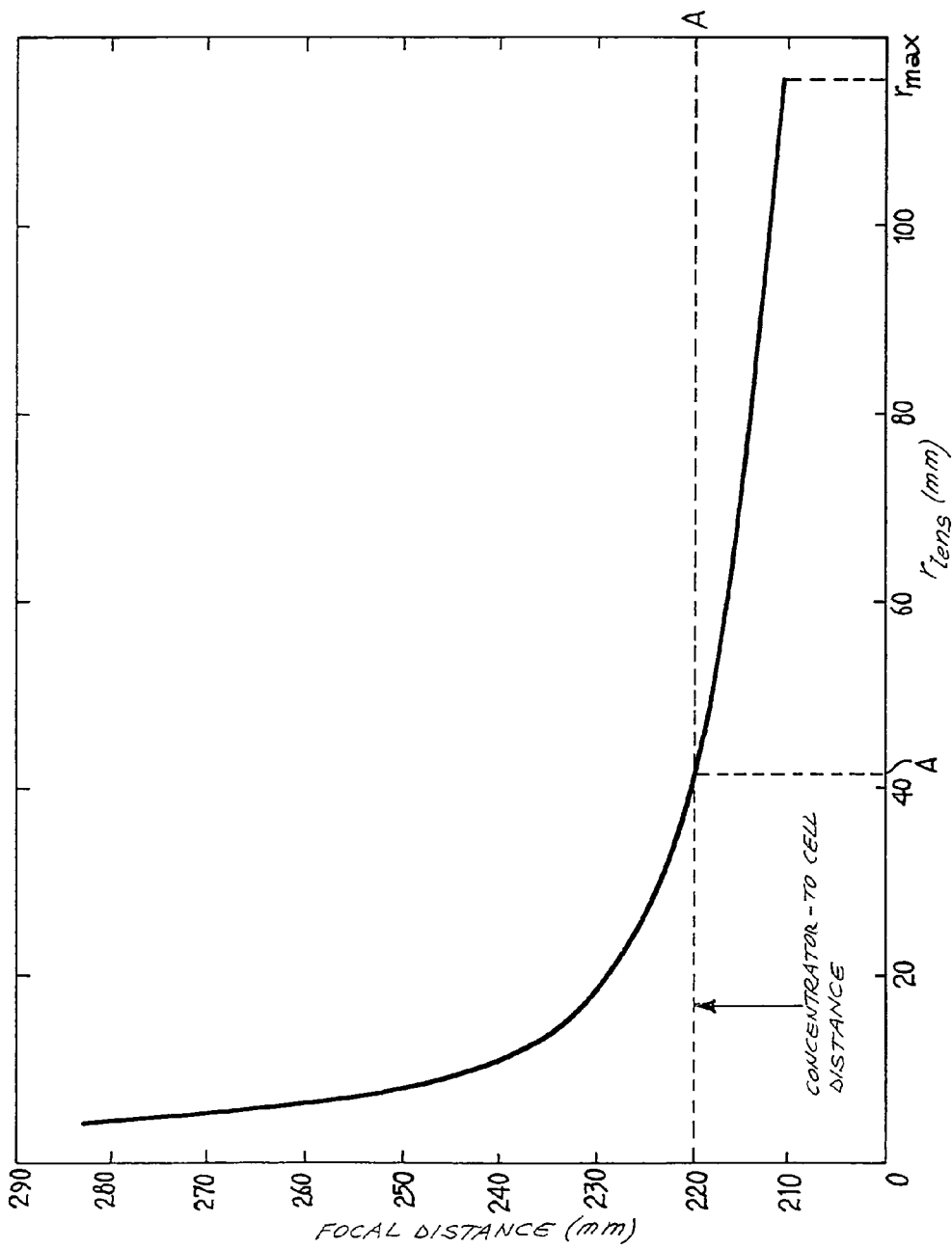
Figure 3D:
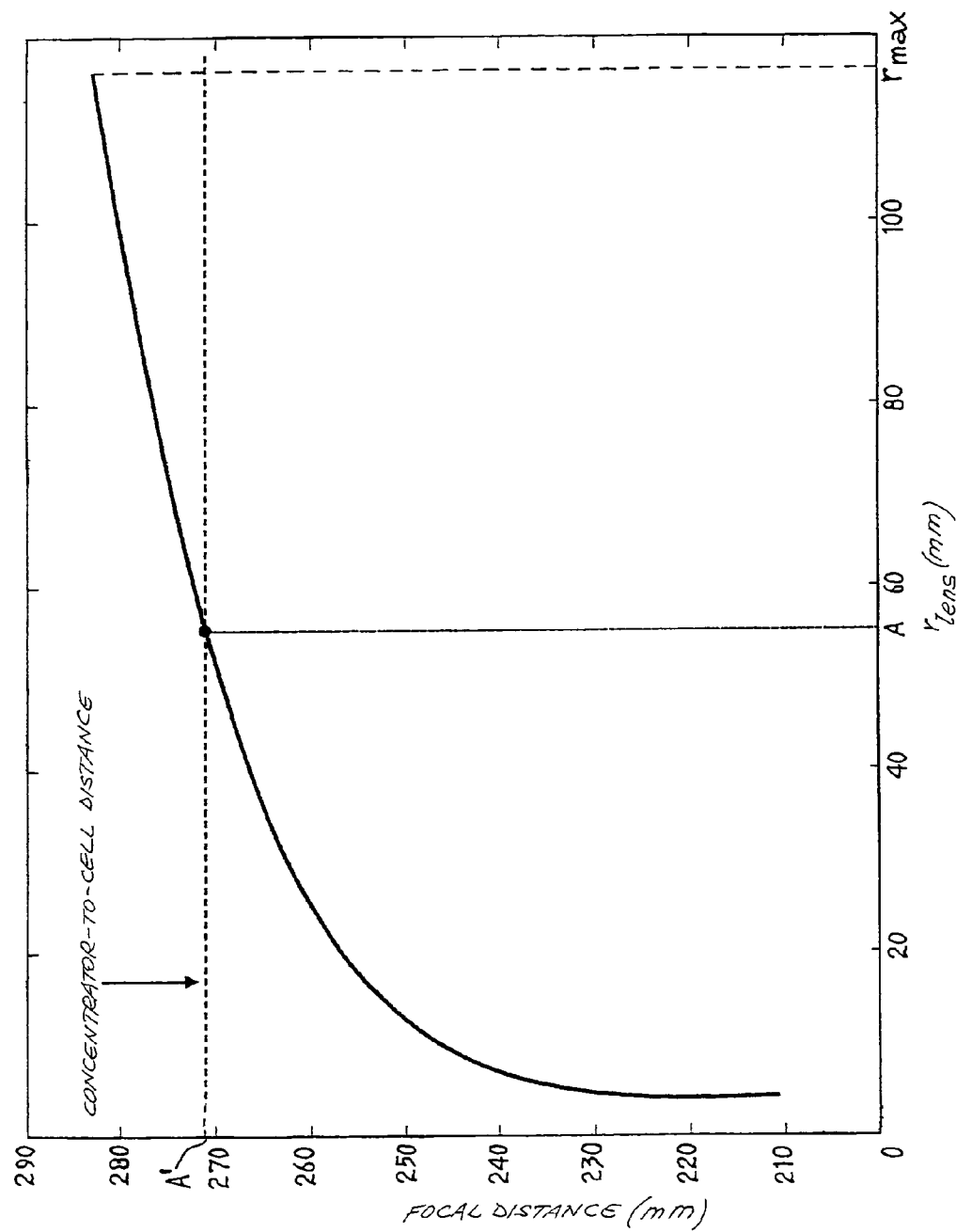

Referring to FIG. 3b, the central portion of the lens, contained between the point $r_{lens}=0$ and the point $r_{lens}=A$ (in which $F(r_{lens})$ reaches the value A' corresponding to the distance between concentrator and cell), has as focal distance a greater value than the concentrator-to-cell distance A'. This implies that a ray of light incident at any point on such central portion of the lens, after being refracted by the lens, will intersect the optical axis beyond the plane of the cell (FIG. 4a, rays indicated by B1 and B2). It follows therefrom that if the cell is displaced towards the lens (by the effect, for example, of errors of positioning) the ray will intersect that plane at a point further out with respect to the original positioning, whereas if the cell is moved away, the ray intersects the plane of the cell at a point closer to the centre of the cell. The rays incident on the lens between $r_{lens}=A$ and $r_{lens}=r_{max}$ intersect the optical axis before meeting the plane of the cell (FIG. 4a, ray indicated by B4); it follows therefrom that if the cell is moved closer to the lens, the reference ray tends to intersect the cell at a point closer to the centre of the cell, whereas if the cell is moved away, the ray tends to intersect the cell at a point closer to the edge. If the focal distance of the lens is calculated according to this criterion and is optimised so as to produce in the plane of the cell a uniform distribution of irradiance, errors in the positioning of the plane of the cell do not alter to any significant extent the uniformity of irradiance; in fact, if the plane of the cell is moved closer to the lens, the reference rays coming from the outer portion of the lens contribute to the illumination of the central portion of the lens, while the inner portion of the lens contributes to the illumination of the outer portion of the cell. The same phenomenon, but with the parts inverted, occurs in the case where the plane of the cell is moved away from the lens. What is obtained in substance is a circle of minimum confusion which renders the system greatly tolerant to defocus (FIG. 4b). The variation of the focal distance may exhibit discontinuities for the purpose of increasing uniformity, efficiency and tolerance to defocus (FIG. 3c).

FIG. 3a represents a typical variation of the focal distance F in dependence on the radial distance from the centre of the lens $r_{lens}$, according to the present invention. As may be observed, luminous rays incident parallel to the optical axis on the central region of the concentrator 10 are focused at lesser distances from the concentrator, and rays incident at increasing radial distances are focused at progressively increasing focal distances, up to an asymptotically constant value, close to the value of the concentrator-to-cell distance A'. The variation of the focal distance with respect to the radius of the lens, having a general profile represented in FIGS. 3a, b, c, d, must from time to time be optimised in order to guarantee a uniform distribution of polychromatic irradiance on the plane of the cell; it should be observed that the multifocal lens thus calculated generally produces a non-uniform irradiance for the individual wavelengths, but the lens is optimised so that the superposition of the distributions of monochromatic irradiance generates a uniform distribution of polychromatic irradiance. With respect to a Fresnel lens with single focal distance, of the type conventionally used as concentrator, the variation of FIGS. 3a, b, c, d differs in that, with a lens with single focal distance, the variation of the focal distance F with respect to the radial distance $r_{lens}$ is defined by a step function at the radius zero. Therefore, the more rapid the increase or the decrease in the focal distance $F(r)$ with respect to the radial distance $r_{lens}$, the closer the lens becomes to the behaviour of a lens with single focal distance.

Figure 10:
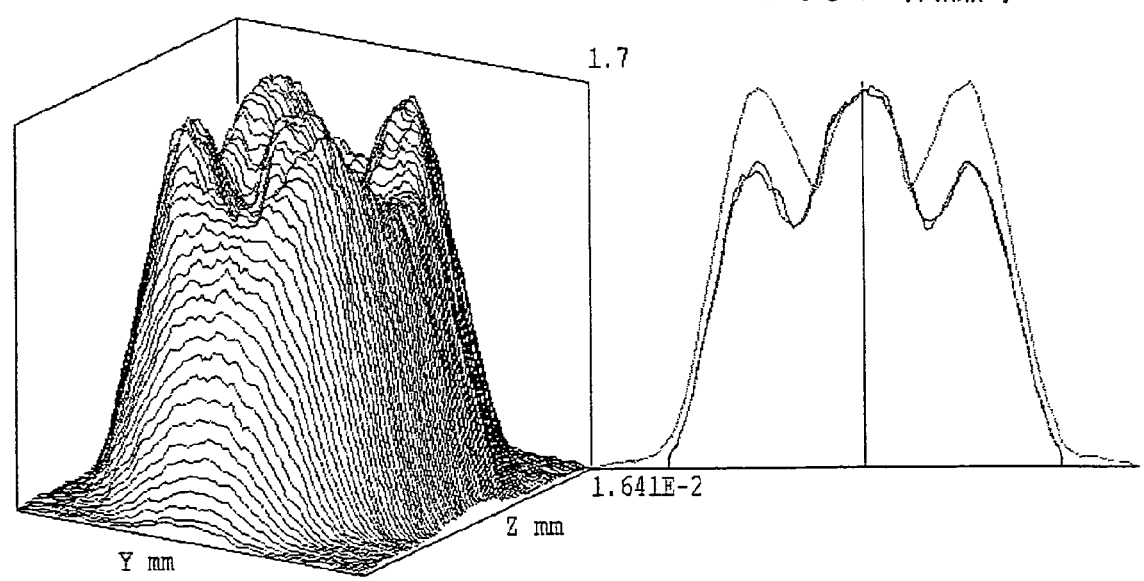
FIG. 10 is a graph which represents the distribution of illuminance on a cell provided with the concentrator according to the invention.

FIG. 10 shows a distribution of polychromatic irradiance on the photovoltaic cell, generated by using a multifocal Fresnel lens according to the invention, having a square shape as in the example described previously, in which the side of the lens is equal to 156 mm, the side of the cell, also square, is equal to 11 mm, and the distance between the concentrator and the cell is equal to 220 mm. The graph was obtained in a simulation with the use of a polychromatic beam (with frequencies between 300 and 1150 nm) having an irradiance spectrum AM1.5D and which has an angle of divergence equal to ±0.275°, or that typical of solar radiation. In the figure it will be noted that the distribution of illuminance on the cell turns out to have a form substantially identical to that of the aperture of the concentrator itself, i.e. square.

As may be observed, the variation of the focal distance illustrated in FIGS. 3a, b, c, d, coupled to a shape of the section of the lens substantially equal to the shape of the conversion cell, guarantees uniformity of the distribution of illuminance on the plane of the cell, optimising in this way the concentration factor.

Figure 11A:
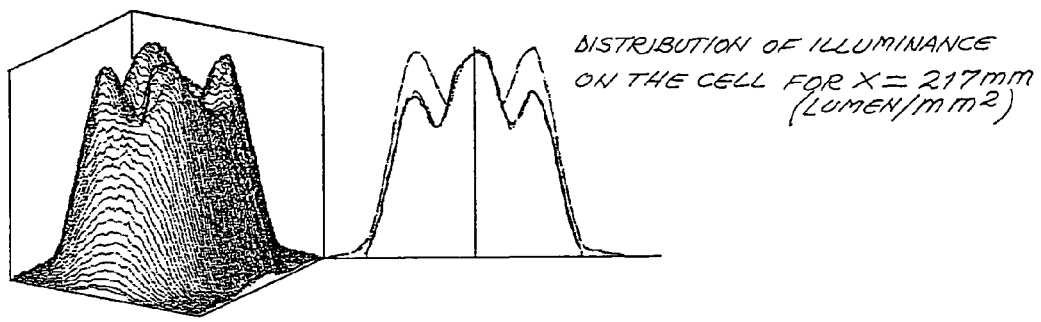
FIGS. 11a,b,c show the distribution of illuminance on the cell generated by a solar concentrator with multifocal Fresnel lens on varying the positioning of the cell with respect to the lens.
Figure 11B:
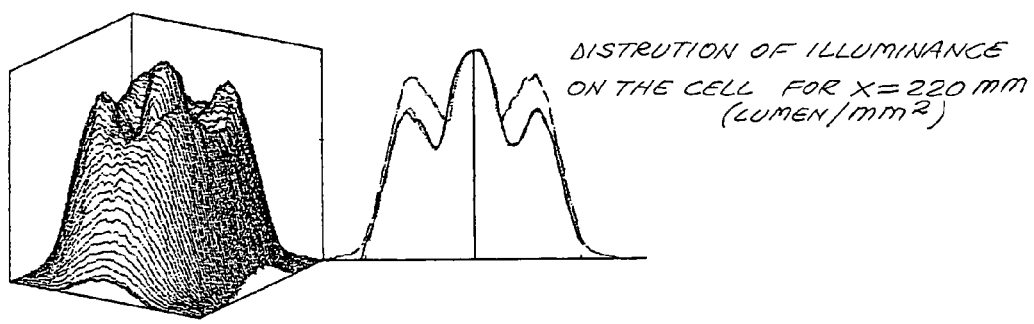
Figure 11C:
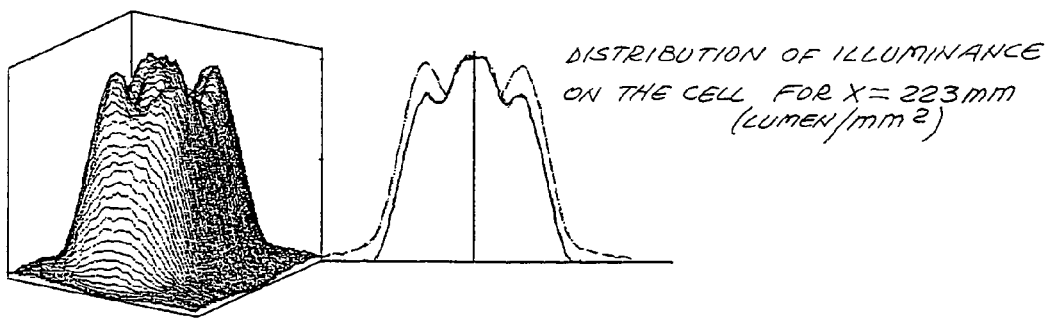

This uniformity of distribution may be seen in FIGS. 11a, b, c, a consequence of a focal distance variation of the type shown in FIG. 3c. FIG. 11b represents the distribution of illuminance on the plane of the cell in the case where the latter is correctly positioned. In the case where the cell is displaced towards the lens by three millimeters, the distribution of illuminance on the plane of the cell is as in FIG. 11a. As can be seen, the uniformity is maintained and the amount of energy remains substantially unchanged with respect to the case in FIG. 11b. In the case where the cell is moved away from the lens by three millimeters, the distribution of illuminance on the plane of the cell is shown in FIG. 11c. In this case also, the uniformity is maintained and the energy incident on the cell does not vary.

Figure 5:
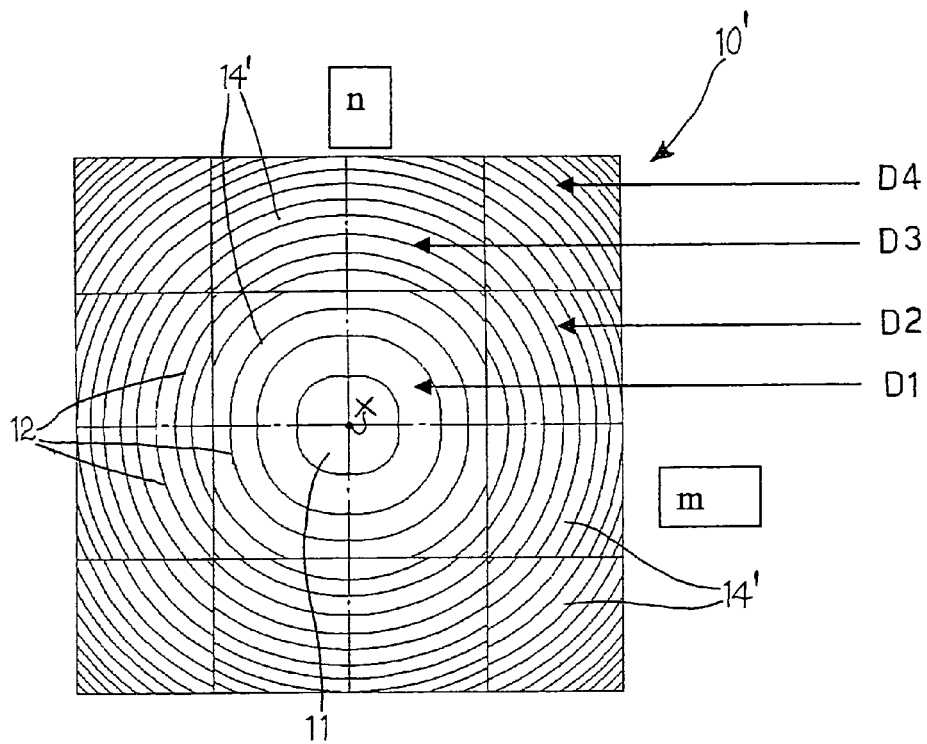
FIG. 5 is a diagrammatic plan view which represents a second variant of the concentrator according to the invention.
Figure 7:
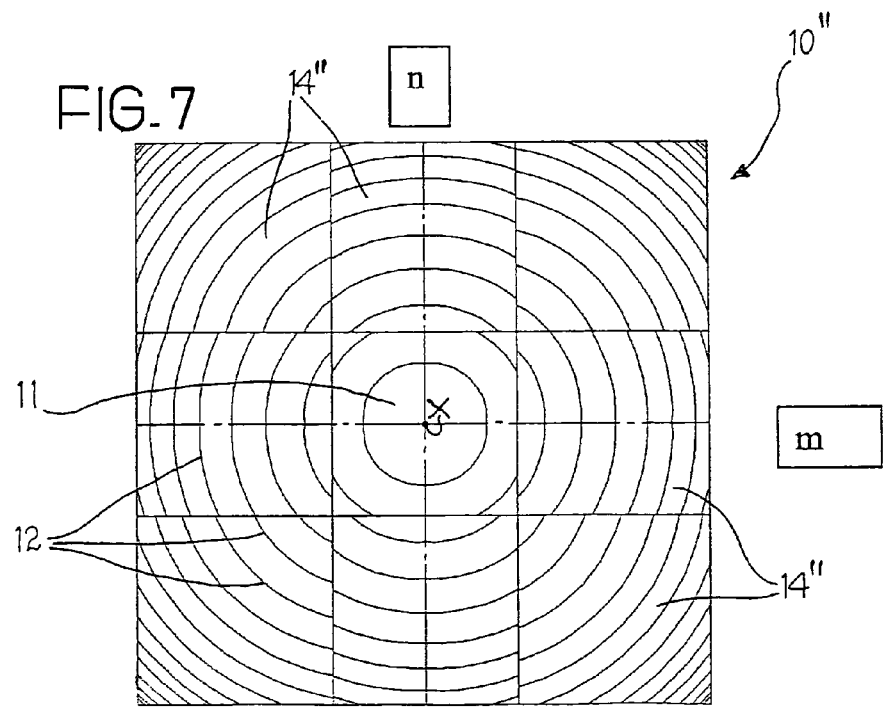
FIG. 7 is a diagrammatic plan view of a third variant of the concentrator according to the invention.
Figure 8:
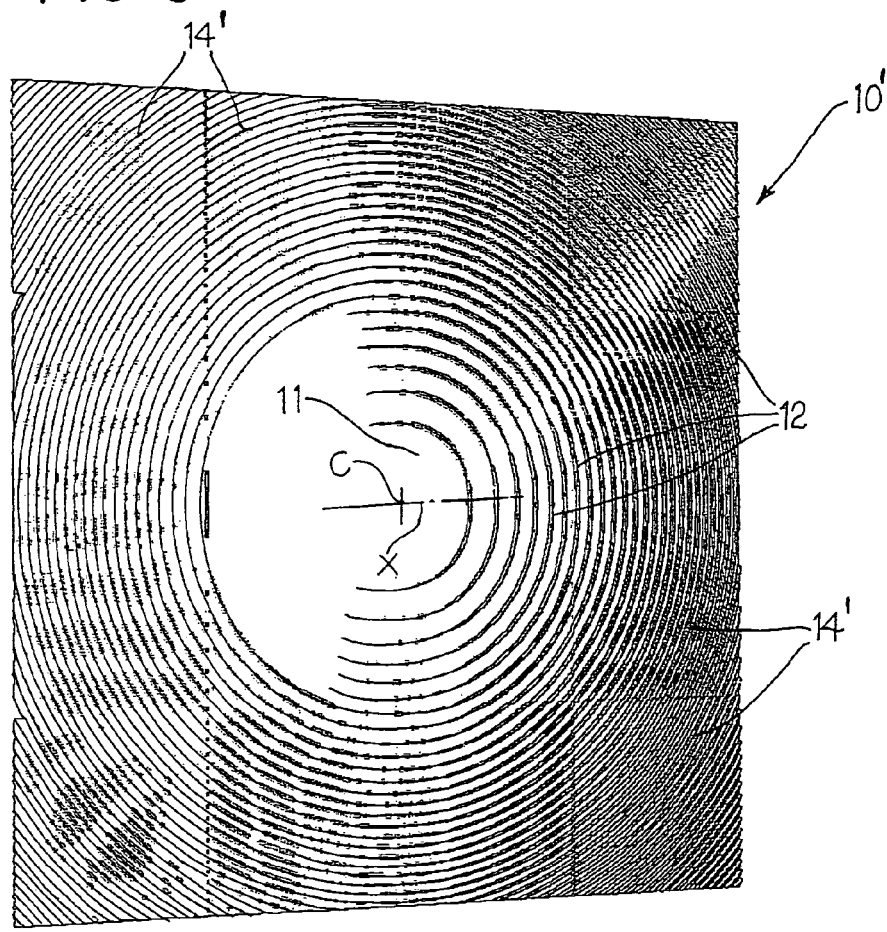
FIG. 8 is a perspective view of the concentrator of FIG. 4.
Figure 6:
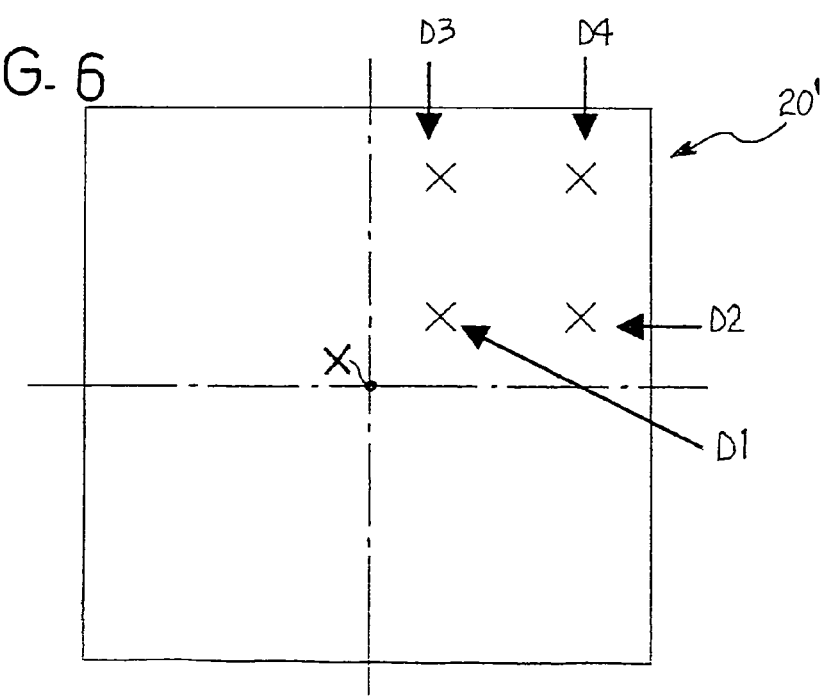
FIG. 6 is a diagram which represents the arrangement of the sectors of the concentrator of FIG. 4.

Other variants of the concentrator according to the invention are illustrated in FIGS. 5, 7 and 8, produced for the purpose of increasing the uniformity of irradiance on the plane of the cell and the tolerance to errors of positioning. FIG. 5 illustrates a concentrator 10' formed by a matrix of n×m sectors 14' having the same area, each constructed from a portion of a multifocal Fresnel lens, of the type described with reference to the variant of FIGS. 2a and 2b. In the example illustrated, the concentrator 10' is formed by a 4×4 matrix of sectors 14', each obtained from a portion of Fresnel lens the axis of rotation of which is translated parallel to the optical axis x of the concentrator 10'. Such an arrangement is illustrated in FIG. 6, which shows diagrammatically a photovoltaic cell 20' having a square receiving surface aligned coaxially with the optical axis of the concentrator 10'. Considering that the photovoltaic cell will have a side significantly less than the side of the concentrator 10', it will consequently be disposed, according to a projection in plan, in the centre C of the concentrator 10'. Considering for example the quadrant of the concentrator 10' formed by the four sectors 14' at top right, indicated respectively by the arrows D1, D2, D3, D4, the respective axes of rotation of the sectors of Fresnel lens will intersect the surface of the cell 20' as indicated by the crosses in FIG. 6, these also indicated by the arrows D1, D2, D3, D4 in such a way as to clarify the relationship of correspondence with the respective sectors 14'. By modifying the position of the axes of rotation of the sectors 14', and selecting for each sector 14' a specific profile of radial variation of the focal distance F, it is possible to optimise the distribution of illuminance so as to be able to obtain the greatest possible uniformity on the plane of the cell 20' and the greatest possible tolerance for displacements of the cell along the optical axis of the system.

In order to reduce as much as possible the effect of chromatic aberration, which becomes more evident at the edges of the concentrator 10' in which the angles of refraction are greater, it is preferable for the more marginal sectors 14' to have a focal distance F as close as possible to that of a Fresnel lens with single focal distance F, having a value close to the distance between cell 20' and concentrator 10'.

FIG. 7 illustrates a variant 10" of the concentrator 10' of FIG. 4, formed by a matrix n×m of sectors 14' of Fresnel lens. This variant 10" differs from that in FIG. 4 solely in that the sectors 14' have surfaces of different area and of different shape, i.e. square and rectangular. This introduces a further degree of freedom to be able to render the distribution of illuminance on the cell 20' more uniform.

Figure 9:
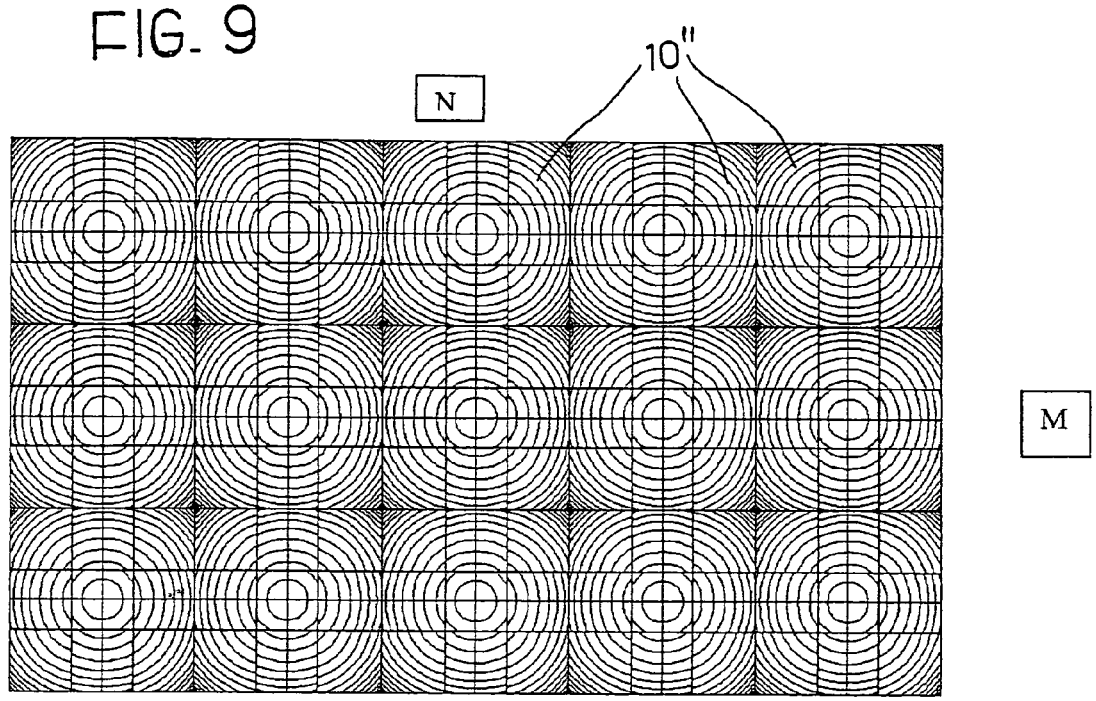
FIG. 9 is a diagrammatic plan view of a matrix formed by concentrators of the type in FIG. 4.
Figure 12:
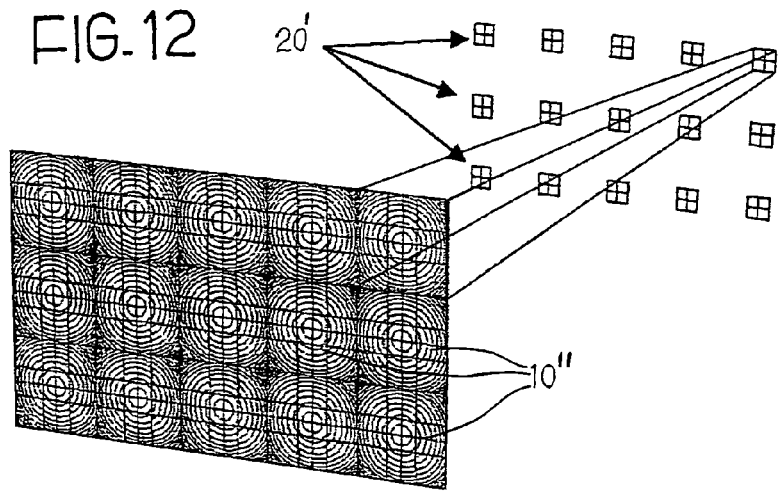
FIG. 12 is a diagrammatic perspective view of a photovoltaic concentration system provided with the matrix of concentrators of FIG. 6.

The concentrators 10, 10'; 10" may be used as single elements or may be assembled in a matrix of N×M elements, to which corresponds a matrix of N×M photovoltaic cells (see FIGS. 9 and 12).

Figure 13A:
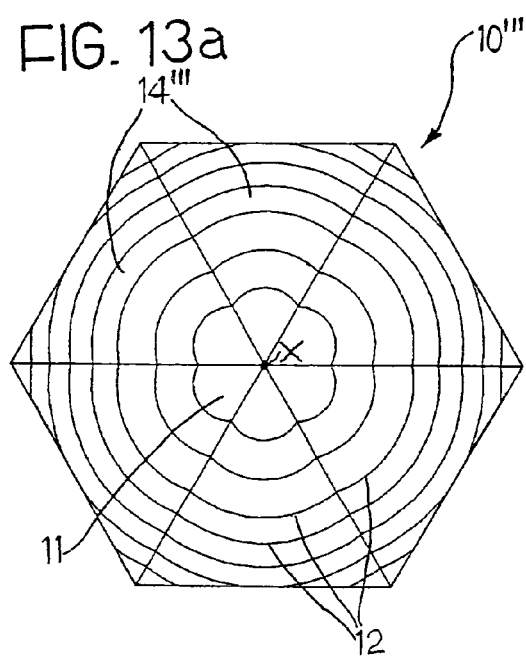
FIGS. 13a,b illustrate a further variant of a concentrator and of a matrix of concentrators according to the invention.
Figure 13B:
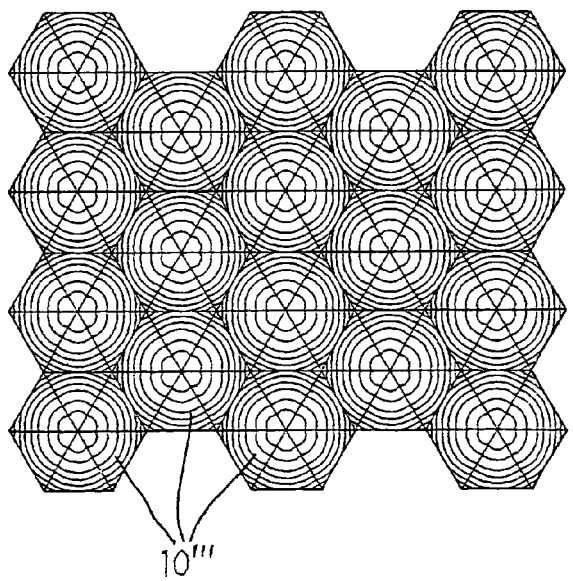

Alternatively, it is possible to use another type of symmetry for the concentrators. For example, as illustrated in FIGS. 13a, b, the concentrators 10''' have a hexagonal symmetry, and are formed by sectors 14''' corresponding to portions of Fresnel lens having axes of rotation translated with respect to the optical axis of the concentrator 10''' and, if required, a different profile of variation of the focal distance F. Of course, the concentrators 10''' formed by equilateral hexagons may also be disposed in a matrix structure (see FIG. 13b), of the honeycomb type.

The concentrators 10, 10', 10", 10''' may be produced singly by injection moulding or by hot pressing of transparent material, for example plastic or vitreous material. In order to obtain a matrix of N×M concentrators, it is possible to adhesively secure the concentrators thus produced on a common plane substrate (of glass or plexiglass with non-scratch protective coating), or to adhesively secure one to the other along their respective edges. Alternatively, the concentrators may be moulded directly on a transparent substrate, starting from a plane substrate and following a hot pressing process of the type known as "step&repeat", in which a single element is moulded at a time and between one pressing and the next the substrate is displaced with respect to the die.

Figure 14B:
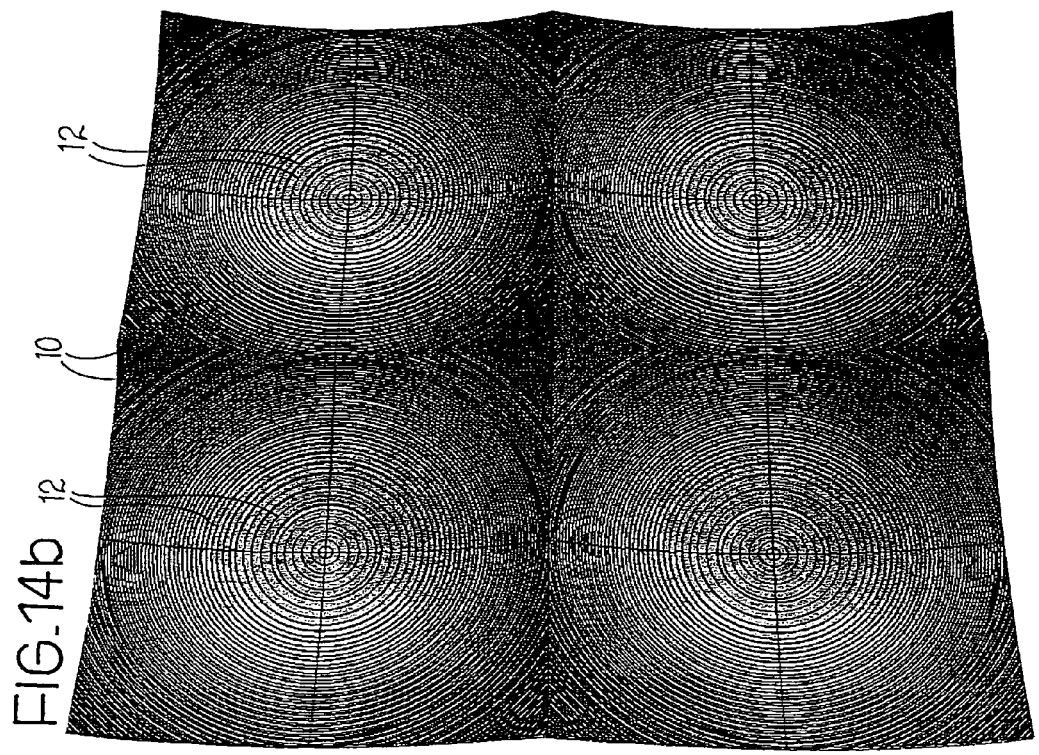
FIGS. 14a, b illustrate a variant of a matrix with concave-convex concentrators.
Figure 14A:
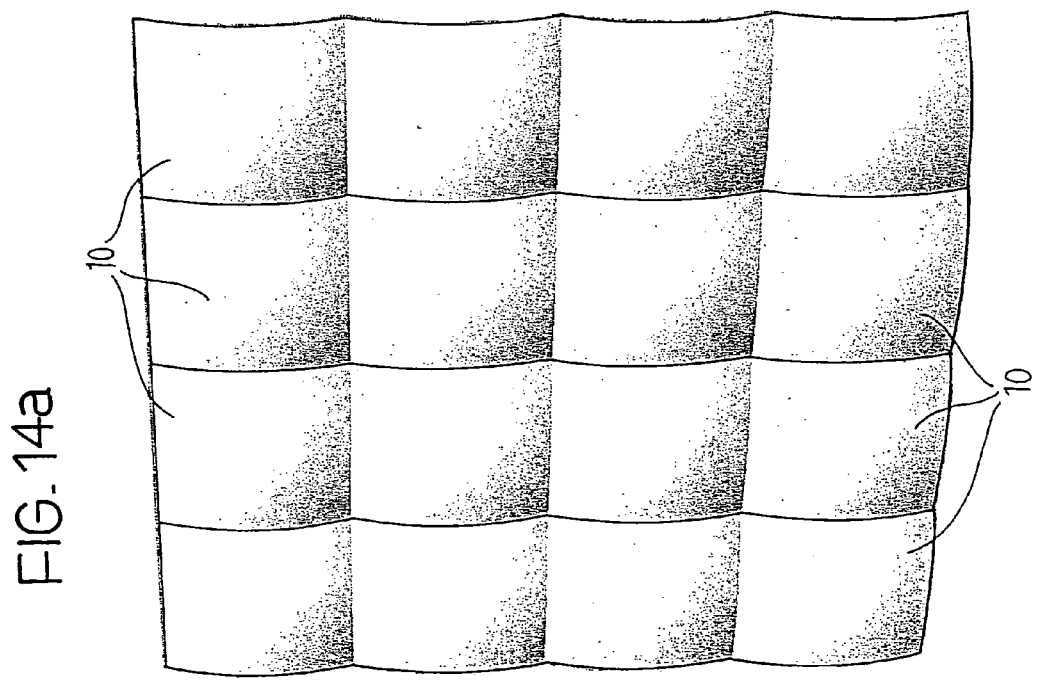

The single Fresnel concentrators of the variants described previously may be produced according to a plane-convex lens configuration, i.e. of the type described hitherto, or concave-convex, i.e. substantially limited by two curved surfaces so as to maintain the thickness thereof constant, with the convexity facing away from the part of the cell or from the opposite side (see FIGS. 14a, 14b). Such a stratagem may make it possible to increase the tolerance to tracking errors.

With the principle of the invention remaining unchanged, the details of production and the embodiments may of course be widely varied with respect to what has been described and illustrated, without thereby departing from the scope of the invention.

What is claimed is:

1. A conversion device for the conversion of radiation into electrical, thermal or chemical energy, comprising:
    a receiving surface; and
    a light concentrator disposed at a predetermined distance from said receiving surface and capable of conveying said radiation towards said receiving surface, said light concentrator including:
    at least one portion of circular Fresnel lens having rotational symmetry about a centre of symmetry, and having a central optical axis, said central optical axis being perpendicular to said portion of circular Fresnel lens, wherein one face of said portion of circular Fresnel lens has a plurality of annular crests disposed concentrically about the centre of symmetry so as to form a segmented transverse profile of said portion of Fresnel lens, and wherein said segmented profile is formed in such a manner that rays incident parallel to the optical axis are focused, at different focal distances, said focal distances being variable in dependence on the radial distance of the rays from the centre of symmetry of the Fresnel lens, the variation of said focal distances being determined such that said focal distances are equal to a maximum value at the center of symmetry of said portion of circular Fresnel lens, decreasing progressively until they reach a minimum value at the edge of said portion of circular Fresnel lens, in such a way that, when said portion of circular Fresnel lens is illuminated by polychromatic radiation, the superposition of the distributions of irradiance, produced by said portion of circular Fresnel lens at the individual wavelengths constituting the spectrum of the incident radiation, generates a substantially uniform distribution of polychromatic irradiance on said receiving surface of the conversion device.

2. A device according to claim 1, wherein said light concentrator has an aperture of a shape substantially equal to that of said receiving surface of the conversion device.

3. A device according to claim 1, wherein said minimum value of the focal distance is substantially equal to said predetermined distance between light concentrator and receiving surface of the conversion device.

4. A device according to claim 1, wherein said maximum value of the focal distance is more than 10% of the value of the predetermined distance between light concentrator and receiving surface of the conversion device.

5. A device according to claim 1, wherein said maximum value of the focal distance is greater than the value of the predetermined distance between light concentrator and receiving surface of the conversion device, and said minimum value is slightly lower than the value of the predetermined distance between light concentrator and receiving surface of the conversion device.

6. A device according to claim 1, wherein said portion of circular Fresnel lens has the crests having a constant height.

7. A device according to claim 1, wherein said portion of circular Fresnel lens has adjacent crests having constant value of the radial distance between them.

8. A device according to claim 1, wherein said light concentrator comprises a plurality of contiguous sectors, each sector being formed by a portion of circular Fresnel lens of rotational symmetry, the axis of symmetry of which is translated parallel to the optical axis of said light concentrator.

9. A device according to claim 8, wherein each sector has a corresponding profile of variation of focal distance in dependence on the radial distance.

10. A device according to claim 8, wherein said sectors have surfaces having areas equal to one another.

11. A device according to claim 1, wherein the shape of said portion of circular Fresnel lens is square, rectangular, hexagonal or circular.

12. A device according to claim 1, wherein said portion of circular Fresnel lens has a concave-convex structure defined by a pair of curved surfaces such that the thickness of said lens is substantially constant.

13. A device according to claim 1, wherein said crests of said portion of circular Fresnel lens are disposed on the surface of said portion of circular Fresnel lens facing said receiving surface.

14. A device according to claim 1, wherein said conversion device is a photovoltaic cell.

15. A device according to claim 1, wherein said conversion device is a cell capable of converting solar radiation directly into thermal energy.

16. A device according to claim 1, comprising a plurality of said light concentrators disposed in a matrix.

\* \* \* \* \*